US012756406B2

(12) United States Patent
Ko et al.

(10) Patent No.: US 12,756,406 B2
(45) Date of Patent: Oct. 6, 2026

(54) LOW-COMPLEXITY DECODER AND OPERATION METHOD THEREOF

(71) Applicant: SAMSUNG ELECTRONICS CO., LTD., Suwon-si (KR)

(72) Inventors: Dongmin Ko, Suwon-si (KR); Chanki Kim, Seoul (KR); Seongjoon Park, Seoul (KR); Jongseon No, Seoul (KR); Jaeho Jeong, Seoul (KR); Youngdon Choi, Suwon-si (KR)

(73) Assignees: Samsung Electronics Co., Ltd., Suwon-si (KR); Seoul National University R & DB Foundation, Suwon-si (KR)

( * ) Notice: Subject to any disclaimer, the term of this patent is extended or adjusted under 35 U.S.C. 154(b) by 54 days.

(21) Appl. No.: 19/019,250

(22) Filed: Jan. 13, 2025

(65) Prior Publication Data

US 2025/0240035 A1 Jul. 24, 2025

(30) Foreign Application Priority Data

Jan. 23, 2024 (KR) ........................ 10-2024-0010403
May 8, 2024 (KR) ........................ 10-2024-0060758

(51) Int. Cl.
*H03M 13/11* (2006.01)

(52) U.S. Cl.
CPC .... *H03M 13/1105* (2013.01); *H03M 13/1148* (2013.01)

(58) Field of Classification Search
CPC ......... H03M 13/1105; H03M 13/1148; H03M 13/152; H03M 13/1575
See application file for complete search history.

(56) References Cited

U.S. PATENT DOCUMENTS

| | | | | |
|---|---|---|---|---|
| 6,990,625 | B2 | 1/2006 | Fujiwara et al. | |
| 8,108,759 | B2 | 1/2012 | Moon et al. | |
| 8,112,696 | B2 | 2/2012 | Cideciyan et al. | |
| 8,196,011 | B2 | 6/2012 | Izumita et al. | |
| 8,230,292 | B2 | 7/2012 | Fujiwara et al. | |
| 9,043,674 | B2 | 5/2015 | Wu et al. | |
| 2003/0091120 | A1* | 5/2003 | Noda | H03M 13/152 375/264 |
| 2011/0307756 | A1* | 12/2011 | Nguyen | H03M 13/1197 714/752 |

(Continued)

*Primary Examiner* — Steve N Nguyen
(74) *Attorney, Agent, or Firm* — Fish & Richardson P.C.

(57) ABSTRACT

A decoder includes a syndrome generator and an error pattern classifier. The syndrome generator generates a first syndrome, a second syndrome, and a third syndrome based on a reception vector and a parity check matrix and outputs the first syndrome, the second syndrome, and the third syndrome, The error pattern classifier receives the first syndrome, obtains symbol error location information obtained based on mapping information between a spotty and adjacent symbol error (SASE) and the first syndrome, changes the first syndrome to a normalized syndrome based on a first received symbol, obtains an adjacent error vector based on mapping information between the normalized syndrome, the second syndrome, and the third syndrome and the SASE, and corrects an error of the reception vector based on the symbol error location information and the adjacent error vector.

20 Claims, 14 Drawing Sheets

(56) References Cited

U.S. PATENT DOCUMENTS

| | | | | |
|---|---|---|---|---|
| 2013/0262957 | A1* | 10/2013 | Wu | H03M 13/152 714/763 |
| 2014/0173386 | A1* | 6/2014 | Kern | H03M 13/616 714/782 |
| 2015/0007001 | A1* | 1/2015 | Kern | H03M 13/159 714/785 |
| 2018/0331700 | A1* | 11/2018 | Lien | H03M 13/07 |
| 2021/0224156 | A1* | 7/2021 | Cho | G06F 11/1076 |
| 2024/0421833 | A1* | 12/2024 | Bryant | H03M 13/1545 |

* cited by examiner t-spotty and s-adjacency symbol error (SASE)

PCM $$H = \begin{pmatrix} H_U \\ H_D \\ 1 \end{pmatrix} = \begin{pmatrix} H_{U,1} & H_{U,2} & \dots & H_{U,\frac{n}{v}} \\ H_{L,1} & H_{L,2} & \dots & H_{L,\frac{n}{v}} \\ 1 & 1 & \dots & 1 \end{pmatrix}$$

FIG. 5B

| | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|
| | H_U,1 | | | | | | | | | | H_U,2 | | | | | | | | | | H_U,3 | | | | | | | | | |
| | H_D,1 | | | | | | | | | | H_D,2 | | | | | | | | | | H_D,3 | | | | | | | | | |
| | H_1 | | | | | | | | | | | | | | | | | | | | | | | | | | | | | |
| | H_G,1 | | | | | H_G,1 | | | | | H_G,2 | | | | | H_G,2 | | | | | H_G,3 | | | | | H_G,3 | | | | |
| | H_M,1 | | | | | H_M,2 | | | | | H_M,1 | | | | | H_M,2 | | | | | H_M,1 | | | | | H_M,2 | | | | |
| | H_1 | | | | | | | | | | | | | | | | | | | | | | | | | | | | | |
| H_U | 1 | 0 | 0 | 0 | 1 | 1 | 0 | 0 | 0 | 1 | 0 | 1 | 0 | 0 | 1 | 0 | 1 | 0 | 0 | 1 | 0 | 0 | 1 | 0 | 0 | 0 | 0 | 1 | 0 | 0 |
| | 0 | 0 | 1 | 1 | 0 | 0 | 0 | 1 | 1 | 0 | 1 | 0 | 0 | 0 | 1 | 1 | 0 | 0 | 0 | 1 | 0 | 1 | 0 | 0 | 1 | 0 | 1 | 0 | 0 | 1 |
| | 0 | 0 | 1 | 0 | 0 | 0 | 0 | 1 | 0 | 0 | 0 | 1 | 1 | 1 | 1 | 0 | 1 | 1 | 1 | 1 | 1 | 0 | 1 | 0 | 1 | 1 | 0 | 1 | 0 | 1 |
| | 0 | 1 | 1 | 1 | 1 | 0 | 1 | 1 | 1 | 1 | 0 | 1 | 1 | 0 | 1 | 0 | 1 | 1 | 0 | 1 | 0 | 1 | 0 | 1 | 1 | 0 | 1 | 0 | 1 | 1 |
| | 0 | 1 | 0 | 0 | 1 | 0 | 1 | 0 | 0 | 1 | 0 | 0 | 1 | 1 | 0 | 0 | 0 | 1 | 1 | 0 | 0 | 1 | 0 | 0 | 1 | 0 | 1 | 0 | 0 | 1 |
| | 0 | 0 | 0 | 0 | 0 | 0 | 0 | 0 | 0 | 0 | 0 | 1 | 0 | 0 | 1 | 0 | 1 | 0 | 0 | 1 | 0 | 0 | 1 | 1 | 0 | 0 | 0 | 1 | 1 | 0 |
| | 0 | 0 | 1 | 0 | 0 | 0 | 0 | 1 | 0 | 0 | 0 | 0 | 0 | 0 | 0 | 0 | 0 | 0 | 0 | 0 | 0 | 1 | 0 | 0 | 1 | 0 | 1 | 0 | 0 | 1 |
| | 0 | 1 | 0 | 0 | 1 | 0 | 1 | 0 | 0 | 1 | 0 | 0 | 1 | 0 | 0 | 0 | 0 | 1 | 0 | 0 | 0 | 0 | 0 | 0 | 0 | 0 | 0 | 0 | 0 | 0 |
| H_D | 1 | 0 | 0 | 1 | 0 | 0 | 0 | 1 | 0 | 1 | 1 | 0 | 0 | 1 | 0 | 0 | 0 | 1 | 0 | 1 | 1 | 0 | 0 | 1 | 0 | 0 | 0 | 1 | 0 | 1 |
| | 0 | 1 | 0 | 1 | 1 | 1 | 0 | 1 | 1 | 1 | 0 | 1 | 0 | 1 | 1 | 1 | 0 | 1 | 1 | 1 | 0 | 1 | 0 | 1 | 1 | 1 | 0 | 1 | 1 | 1 |
| | 0 | 0 | 1 | 0 | 1 | 0 | 1 | 0 | 1 | 1 | 0 | 0 | 1 | 0 | 1 | 0 | 1 | 0 | 1 | 1 | 0 | 0 | 1 | 0 | 1 | 0 | 1 | 0 | 1 | 1 |
| H_1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |

FIG. 5C

Inverted Matrix

| pl | | | | d | | | | | p | d | | | | p | | | | | d | | | p | d | | p | d | | | |
|---|---|---|---|---|---|---|---|---|---|---|---|---|---|---|---|---|---|---|---|---|---|---|---|---|---|---|---|---|---|
| | | | | | | | | | | | | | | | | | | | | | | | | | | | | | |
| 1 | 0 | 0 | 0 | 0 | 1 | 1 | 1 | 1 | 0 | 0 | 1 | 1 | 1 | 0 | 0 | 0 | 0 | 0 | 0 | 0 | 0 | 0 | 0 | 1 | 0 | 1 | 1 | 1 | 1 |
| 0 | 1 | 0 | 0 | 0 | 1 | 1 | 0 | 1 | 0 | 1 | 0 | 0 | 1 | 0 | 0 | 0 | 0 | 0 | 0 | 1 | 0 | 0 | 1 | 0 | 0 | 0 | 0 | 0 | 0 |
| 0 | 0 | 1 | 0 | 0 | 0 | 0 | 1 | 0 | 0 | 0 | 0 | 0 | 0 | 0 | 0 | 0 | 0 | 0 | 0 | 0 | 1 | 0 | 0 | 1 | 0 | 1 | 0 | 0 | 1 |
| 0 | 0 | 0 | 1 | 1 | 0 | 1 | 0 | 0 | 0 | 0 | 1 | 0 | 1 | 0 | 0 | 0 | 0 | 0 | 1 | 0 | 0 | 0 | 0 | 1 | 0 | 1 | 0 | 1 | 0 |
| 0 | 0 | 0 | 0 | 1 | 1 | 1 | 0 | 0 | 0 | 0 | 1 | 0 | 0 | 0 | 1 | 0 | 0 | 0 | 1 | 1 | 1 | 0 | 1 | 1 | 0 | 0 | 0 | 1 | 0 |
| 0 | 0 | 0 | 0 | 1 | 1 | 1 | 0 | 0 | 0 | 1 | 0 | 0 | 0 | 0 | 0 | 1 | 0 | 0 | 1 | 1 | 1 | 0 | 0 | 1 | 0 | 0 | 0 | 0 | 0 |
| 0 | 0 | 0 | 0 | 0 | 1 | 1 | 1 | 0 | 0 | 1 | 1 | 0 | 0 | 0 | 0 | 0 | 1 | 0 | 0 | 1 | 0 | 0 | 0 | 1 | 0 | 1 | 1 | 0 | 1 |
| 0 | 0 | 0 | 0 | 0 | 0 | 0 | 0 | 0 | 0 | 0 | 0 | 0 | 1 | 0 | 0 | 0 | 0 | 1 | 0 | 0 | 1 | 0 | 0 | 1 | 0 | 1 | 0 | 0 | 1 |
| 0 | 0 | 0 | 0 | 1 | 0 | 1 | 1 | 1 | 1 | 0 | 1 | 1 | 1 | 0 | 0 | 0 | 0 | 0 | 0 | 0 | 0 | 0 | 1 | 1 | 0 | 1 | 1 | 0 | 1 |
| 0 | 0 | 0 | 0 | 0 | 1 | 0 | 0 | 1 | 0 | 1 | 0 | 0 | 1 | 1 | 0 | 0 | 0 | 0 | 1 | 1 | 1 | 0 | 1 | 0 | 0 | 1 | 0 | 0 | 0 |
| 0 | 0 | 0 | 0 | 1 | 0 | 1 | 0 | 1 | 0 | 0 | 1 | 0 | 1 | 0 | 0 | 0 | 0 | 0 | 1 | 0 | 0 | 1 | 0 | 1 | 0 | 1 | 1 | 1 | 0 |
| 0 | 0 | 0 | 0 | 0 | 1 | 1 | 1 | 0 | 0 | 1 | 1 | 1 | 0 | 0 | 0 | 0 | 0 | 0 | 0 | 0 | 0 | 0 | 1 | 0 | 1 | 1 | 1 | 1 | 0 |

LOW-COMPLEXITY DECODER AND OPERATION METHOD THEREOF

CROSS-REFERENCE TO RELATED APPLICATIONS

This application is based on and claims priority under 35 U.S.C. § 119 to Korean Patent Application No. 10-2024-0010403, filed on Jan. 23, 2024, in the Korean Intellectual Property Office, and Korean Patent Application No. 10-2024-0060758, filed on May 8, 2024, in the Korean Intellectual Property Office, the disclosures of which are incorporated by reference herein in their entirety.

BACKGROUND

An error correction circuit may perform error correction coding (ECC) to correct error bits included in information data.

As the communication speed and data throughput increase, the number of error bits included in information data may increase. With the increase in the number of error bits, error correction latency from when an error correction decoder receives information data until the error correction decoder outputs correction data may increase.

SUMMARY

The disclosure provides a low-delay decoder to correct a new error pattern and an operation method of a decoder.

According to implementations, a decoder includes a syndrome generator configured to generate a first syndrome, a second syndrome, and a third syndrome based on a reception vector and a parity check matrix and output the first syndrome, the second syndrome, and the third syndrome, and an error pattern classifier configured to receive the first syndrome, obtain symbol error location information obtained based on mapping information between a spotty and adjacent symbol error (SASE) and the first syndrome, change the first syndrome to a normalized syndrome based on a first received symbol, obtain an adjacent error vector based on mapping information between the normalized syndrome, the second syndrome, and the third syndrome and the SASE, and correct an error of the reception vector based on the symbol error location information and the adjacent error vector. The SASE is an error pattern based on adjacency between erroneous bits among bits in a 2-dimensional (2D) array, the number of error bits within the adjacency, and the length of the first received symbol.

According to implementations, a decoder includes a syndrome generator configured to generate a first syndrome, a second syndrome, and a third syndrome based on a reception vector and a parity check matrix and output the first syndrome, the second syndrome, and the third syndrome, and an error pattern classifier configured to receive the first syndrome, obtain symbol error location information obtained based on mapping information between a SASE and the first syndrome, change the first syndrome to a normalized syndrome based on the first received symbol, obtain an adjacent error vector based on mapping information between the normalized syndrome, the second syndrome, and the third syndrome and the SASE, and correct an error of the reception vector based on the symbol error location information and the adjacent error vector. The SASE is an error pattern based on adjacency between erroneous bits of bits in a 2D array, the number of error bits within the adjacency, and the length of the first received symbol.

According to implementations, an operation method of a decoder including generating a first syndrome, a second syndrome, and a third syndrome based on a reception vector and a parity check matrix, obtaining symbol error location information obtained based on mapping information between a SASE and the first syndrome, changing the first syndrome to a normalized syndrome based on the first received symbol, obtaining an adjacent error vector based on mapping information between the normalized syndrome, the second syndrome, and the third syndrome and the SASE, and correcting an error of the reception vector based on the symbol error location information and the adjacent error vector. The SASE is an error pattern based on adjacency between erroneous bits, a number of error bits within the adjacency, and the length of the first received symbol.

BRIEF DESCRIPTION OF THE DRAWINGS

Implementations will be more clearly understood from the following detailed description taken in conjunction with the accompanying drawings in which:

FIG. 5B illustrates the SASEC according to implementations;

FIG. 5C illustrates an encoding output according to implementations;

DETAILED DESCRIPTION

Hereinafter, various implementations are described with reference to the accompanying drawings.

For convenience of explanation, terms, such as "decoding", "error correction operation," and the like are interchangeably used in the following description. These terms may have the same meaning or different meanings depending on the context of the implementations, and the meaning of each term will be understood according to the context of the implementations to be described.

In the disclosure, $1_l$ denotes all-one vectors of length-l. In the disclosure, $0_l$ denotes all-zero vectors of length-l. l may denote a positive integer. v may denote a binary low vector of length-l. $v_i$ may denote an i-th element of v ($i \in [l]$). A support set of v may be represented as supp(v) $\{i; v_i \neq 0\}$. A Hamming weight of v may be represented as $|v| = |supp(v)|$. A difference $\|v\|$ of the vector v may be a maximum integer $|i-j|$ with respect to integers $i,j \in supp(v)$. $[\alpha^i]$, as a vector expression of a field element, may be an m×1 column vector obtained from an additional m-tuple expression of $\alpha^i$ with respect to a basis $\{1, \alpha, \ldots, \alpha^{m-1}\}$ under a finite field $\mathbb{F}_2$ m having a primitive element α. $T(\alpha,b)=([\alpha^i], [\alpha^2], \ldots [\alpha^b])$ may be a companion matrix with respect to an m-degree primitive element $\alpha^i$ and a column length b.

Additionally, a read-only memory (ROM) table may be represented by a symbolic expression $\mathcal{T}$. $\mathcal{T}: \mathcal{S} \rightarrow \varepsilon$ may mean one-to-one mapping from an $l_e \varepsilon$ $l_s$-tuple syndrome vector set $\mathcal{S}$. In other words, the ROM table may include mapping information between a correctable spotty and adjacent symbol error (SASE) and a corresponding syndrome. The ROM table $\mathcal{T}$ may be represented by a $|\mathcal{S}| \times (l_s + l_e)$ binary matrix. Here, each row may include a syndrome and error vectors corresponding thereto.

In the disclosure, [a, b] may mean $\{i \in \mathbb{Z}; a \leq i \leq b\}$ $i \geq 1$, with respect to an integers set $\mathbb{Z}$. A binary linear code $\mathcal{C}$ may be defined with parameters (n, k, d) on a binary field $\mathbb{F}_2$. Letter n may denote a codelength. Letter k may denote a message length. Letter d may denote a minimum Hamming distance $d = min_{c \in \mathcal{C} \setminus \{0\}} wt(c)$ of the code $\mathcal{C}$. A k×n generation matrix G or an (n −k)×n parity check matrix (PCM) H may be used to characterize a binary linear code. In the disclosure, code design may be used to be mixed with designing of the PCM H.

Figure 1A:
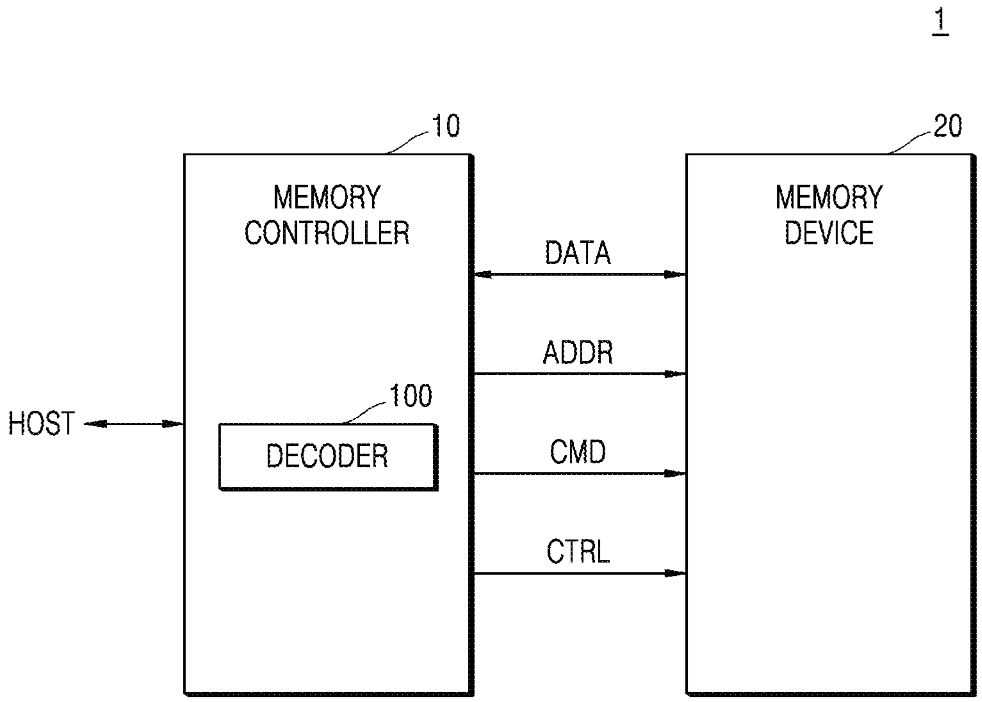
FIG. 1A is a block diagram of a memory system according to implementations.

FIG. 1A is a block diagram of a memory system 1 according to implementations.

Referring to FIG. 1A, the memory system 1 may include a memory controller 10 and a memory device 20. The memory system 1 may be referred to as a storage device. Furthermore, the memory system 1 may refer to an integrated circuit, an electronic device or system, a smartphone, a tablet personal computer (PC), a computer, a server, a workstation, a portable communication terminal, a personal digital assistant (PDA), a portable multimedia player (PMP), a computing device such as other appropriate computers and the like, a virtual machine or a virtual computing device thereof, and the like. Alternatively, the memory system 1 may be one of components included in a computing system such as a graphics card. According to implementations, the memory system 1 may be implemented by an unbuffered dual in-line memory module (UDIMM), a registered DIMM (RDIMM), a load reduced DIMM (LRDIMM), a fully buffered DIMM (FBDIMM), a small outline DIMM (SODIMM), and the like.

The memory device 20 may include a memory cell array including a plurality of memory cells. The memory cell array may include a plurality of word lines, a plurality of bit lines, and a plurality of memory cells formed at positions where the word lines and the bit lines intersect with each other. The memory cells of a memory cell array may include volatile memory cells (e.g., dynamic random access memory (DRAM) cells, static RAM (SRAM) cells, etc.), non-volatile memory cells (e.g., flash memory cells, resistive RAM (ReRAM) cells, phase change RAM (PRAM) cells, magnetic RAM (MRAM) cells, or memory cells of any other types.

In some implementations, the memory system 1 may be implemented as a memory that can be built in or is detachable from an electronic device. For example, the memory system 1 may be implemented in various forms, such as an embedded universal flash storage (UFS) memory device, an embedded multi-media card (eMMC), a solid state drive (SSD), a UFS memory card, a compact flash (CF), a secure digital (SD) card, a micro-SD card, a mini-SD card, an extreme digital (xD) card, a Memory Stick, or the like.

The memory controller 10 may control the memory device 20 to read data stored in the memory device 20 or write data to the memory device 20 in response to a write/read request from a host HOST. In detail, the memory controller 10 may control write, read, and erase operations with respect to the memory device 20, by providing an address ADDR, a command CMD, and a control signal CTRL to the memory device 20. Furthermore, data DATA to be stored in the memory device 20 and the data DATA read from the memory device 20 may be transceived between the memory controller 10 and the memory device 20.

The memory controller 10 may include a decoder 100. The decoder 100 may perform decoding using error correcting code (ECC) on the data read from the memory device 20. The decoder 100 may correct an error of the read data by performing decoding.

For example, the decoder 100 may correct the data read from the memory cell array of the memory device 20.

For example, the decoder 100 may correct the data received from the host HOST. The memory system 1 may communicate in an interconnect (e.g., PCIe) environment of the host HOST, and the decoder 100 may correct the data received from the host HOST.

The memory system 1 according to implementations may include the memory device 20 including a plurality of memory cells and the memory controller 10 correcting the data read from the memory device 20. The memory controller 10 may include the decoder 100. The decoder 100 may include a syndrome generator configured to generate a first syndrome, a second syndrome, and a third syndrome based on a reception vector and a parity check matrix, and to output the first syndrome, the second syndrome, and the third syndrome. The decoder 100 may include a symbol error locator configured to receive the first syndrome and output symbol error location information obtained based on mapping information between a SASE and the first syndrome. The decoder 100 may include a symbol normalizer configured to change the first syndrome to a normalized syndrome based on a first received symbol and output the normalized syndrome, and an adjacent error locator configured to receive the normalized syndrome from the symbol normalizer and the second syndrome and the third syndrome from the syndrome generator, and to output an adjacent error vector. The decoder 100 may include an error corrector configured to receive symbol error location information from the symbol error locator, receive the adjacent error vector from the adjacent error locator, and correct an error of the reception vector. The SASE is an error pattern based on adjacency between erroneous bits among bits in a 2-dimensional (2D) array, the number of error bits within the adjacency, and the length of a symbol.

The parity check matrix may include a first sub-parity check matrix, a second sub-parity check matrix, and a third sub-parity check matrix. The PCM is described below in detail with reference to FIG. 4. The first sub-parity check matrix may be based on a locally repairable code (LRC). The second sub-parity check matrix may be based on a Bose-Chaudhuri-Hocquenghem (BCH) code. The third sub-parity check matrix is an all-one vector. The syndrome generator may generate the first syndrome based on the reception vector and the first sub-parity check matrix, generate the second syndrome based on the reception vector and the second sub-parity check matrix, and generate the third syndrome based on the reception vector and the third sub-parity check matrix.

The adjacent error locator may output the adjacent error vector based on the normalized syndrome, the second syndrome, and mapping information between the third syndrome and the SASE. When the first syndrome, the second syndrome, and the third syndrome are all all-zero vectors, the syndrome generator may output a no error (NE) flag signal. When the normalized syndrome is not obtained, at least one of the symbol normalizer and the symbol error locator may output a detectable, but uncorrected error (DUE) flag signal. When the adjacent error locator obtains the adjacent error vector from a symbol indicating the symbol error location information, a correctable error (CE) flag signal may be output.

Figure 1B:
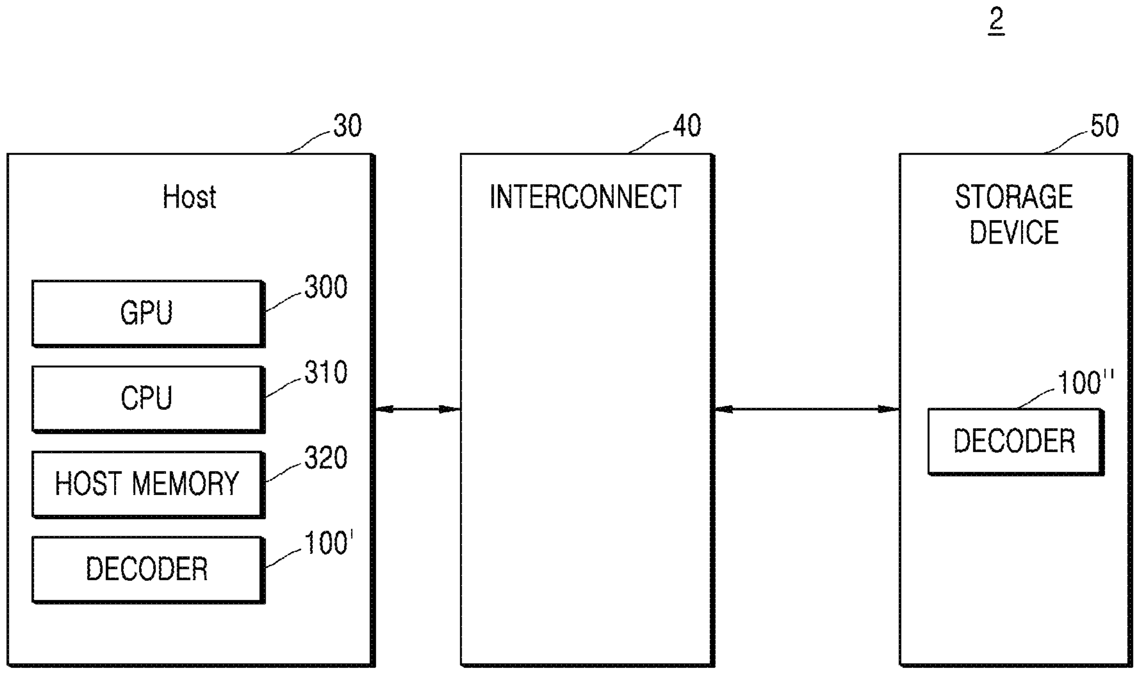
FIG. 1B is a block diagram of a computing system according to implementations.

FIG. 1B is a block diagram of a computing system 2 according to implementations. FIG. 1B may be described with reference to FIG. 1A.

Referring to FIG. 1B, the computing system 2 according to implementations may include a host 30, an interconnect 40, and a storage device 50. The host 30 may include a decoder 100'. The storage device 50 may include a decoder 100".

The decoder 100' may decode and correct data that the host 30 receives through the interconnect 40. The decoder 100" may decode and correct data that the storage device 50 receives through the interconnect 40. The decoder 100' and the decoder 100" may operate as the decoder 100 described above in FIG. 1A. The SASE according to implementations may occur in the environment of the interconnect 40, and the decoder 100' and the decoder 100" may correct the SASE. For example, the decoder 100' and the decoder 100" may each include a syndrome generator configured to generate the first syndrome, the second syndrome, and the third syndrome based on the reception vector and the parity check matrix, and output the first syndrome, the second syndrome, and the third syndrome. The decoder 100' and the decoder 100" may each include a symbol error locator configured to receive the first syndrome and output symbol error location information obtained based on the mapping information between the SASE and the first syndrome. The decoder 100' and the decoder 100" may each include a symbol normalizer configured to change the first syndrome to a normalized syndrome based on a first received symbol and output the normalized syndrome, and an adjacent error locator configured to receive the normalized syndrome from the symbol normalizer and the second syndrome and the third syndrome from the syndrome generator, and to output an adjacent error vector. The decoder 100' and the decoder 100" may each include an error corrector configured to receive symbol error location information from the symbol error locator, receive the adjacent error vector from the adjacent error locator, and correct an error of the reception vector.

For example, the storage device 50 may include UFS, eMMC, SSD, a UFS memory card, a compact flash (CF), an SD card, a micro-SD card, a mini-SD card, an xD card, a Memory Stick, or the like. The storage device 50 is not limited to the implementations described above and may include various storages.

The interconnect 40 enables communication between the host 30 and the storage device 50. For example, the interconnect 40 may include a peripheral component interconnect express (PCIe) and is not limited to the implementations described above.

The host 30 may include at least one of processors 300 and 310. For example, the host 30 may include a GPU 300 and a CPU 310. The host 30 may include various processors and is not limited to the implementations described above. Furthermore, the host 30 may include a host memory 320.

The SASE described in this disclosure may occur in a chip-to-chip interconnect environment including the communication between the storage device 50 and the host 30, and the error correction method according to the disclosure may be applied thereto. For example, the error correction method according to the disclosure may be applied to the communication between the CPU 310 and the GPU 200, the communication between a network interface card (NIC) and the CPU 310, and the like.

Figure 2:
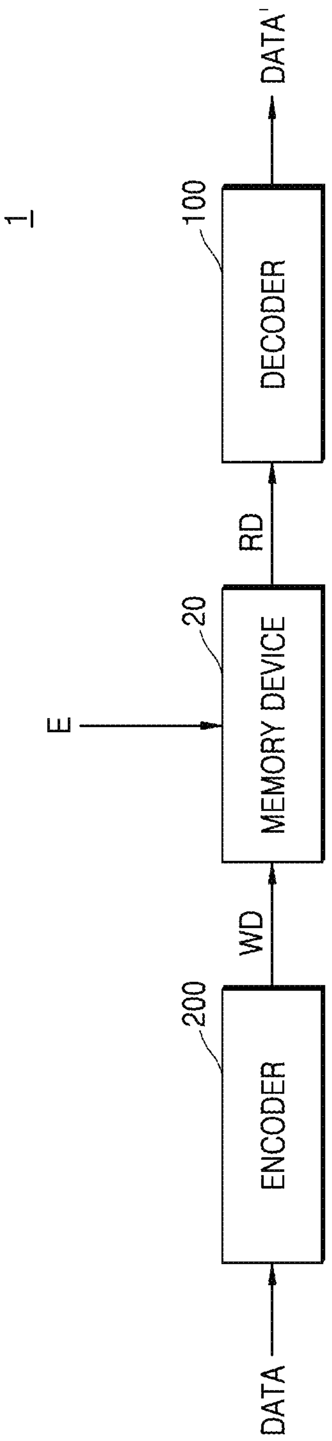
FIG. 2 is a block diagram showing a method in which a memory system according to implementations encodes and decodes data.

FIG. 2 is a block diagram showing a method in which the memory system 1 according to implementations encodes and decodes data.

Referring to FIG. 2, the memory system 1 may further include an encoder 200 in addition to the memory device 20 and the decoder 100 illustrated in FIG. 1A. In implementations, the encoder 200 may be included in the memory controller 10 of FIG. 1A.

First, when the data DATA from the host HOST (see FIG. 1) is input to the memory controller 10, the input data may be encoded by the encoder 200. In this state, the encoder 200 may perform encoding on the input data. Here, the encoded data may be referred to as an encoded codeword.

In other words, the encoder 200 may generate a codeword by performing spotty and adjacent symbol error correcting code encoding (SASEC) on the data DATA. The encoded data (e.g., a plurality of codewords) may be written, as write data WD, to the memory device 20.

When receiving a read command, the memory system 1 may read the data stored in the memory device 20, as read data RD. In this state, the read data RD may include an error E that has occurred for various reasons. For example, the error E may occur due to a misoperation when the write data WD is programmed or a data loss while the write data WD is stored in the memory device 20. Alternatively, the error E may occur due to a misoperation in a read operation of reading the read data RD.

To remove the error E, the decoder 100 may perform the SASEC code decoding (combination code decoding) on the read data RD. Here, the read data RD may be referred to as a read codeword. A decoding result may be output as a corrected data DATA'.

Figure 3A:
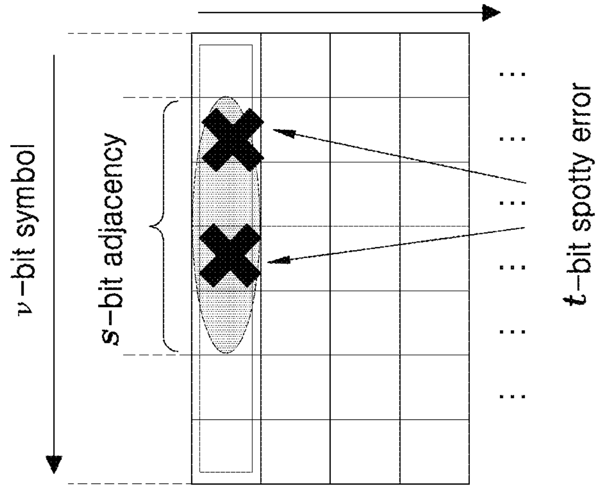
FIG. 3A illustrates an error pattern that is correctable by a decoder according to implementations.
Figure 3B:
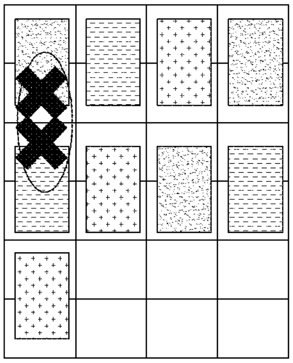
FIG. 3B illustrates an interleaved locally repairable code (LRC)

FIG. 3A illustrates an error pattern that is correctable by a decoder according to implementations. FIG. 3B illustrates an interleaved LRC.

Referring to FIG. 3A, the error pattern described by this disclosure has a 2D array structure. The error described by this disclosure may be referred to as the SASE.

The SASE may be defined as follows. For integers t, s, and v, s denotes adjacency between erroneous bits, t denotes error correction capability, and v denotes the length of a symbol. t may denote a spotty error bit within adjacency s. An index difference between error bits may be s at its maximum. s may be less than or equal to v. The bits within the adjacency s may be error bits, and t spotty error bits may be included in the adjacency s. An error may occur in a symbol unit, and in a 2D error pattern in FIG. 3A, a vertical column may be a symbol unit. (t/s/v)-SASE may be represented as a set $\mathcal{E}_{\mathcal{A}}$. The set $\mathcal{E}_{\mathcal{A}}$ may include n-length error vectors $e_{\mathcal{A}}=[e_1, \ldots, e_u] \in \mathcal{E}_{\mathcal{A}}$. The SASE may be considered as generalization of a single bit error (SBE) and a symbol error (SE) by the parameters t, s, and v representing levels of the SASE.

The cardinality of $|\mathcal{E}_{\mathcal{A}}|$, that is, the number of (t, s, v) SASE available in one symbol, may be represented by the following equation.

$$|\varepsilon_{\mathcal{A}}| = \frac{n}{v}\left(v + \sum_{i=2}^{t}\left\{\binom{v}{i} - \sum_{j\in[0,v-s]}(v-s-j)\binom{s+j}{i-2}\right\}\right) \approx 2^{min\{s,t\}}(v-s) \quad \text{[Equation 1]}$$

FIG. 3A shows errors represented by $e_i$ when v=7, s=4, and t=2. Symbols marked by X may be error bits. The error bits may be included in the same adjacency s. The decoding complexity of the error bits included in the same adjacency may be the same. The memory system 1 may lower decoding complexity by adjusting the value of t or s to be lower than v that is the number of symbol bits as a value suitable for a channel situation.

Referring to FIG. 3B, Symbols indicated by the same hatching pattern may denote continuous symbols before being interleaved. While the error bits marked by X are adjacent to each other, and their symbols are interleaved with each other, the decoding complexity of two error bit symbols may be different from each other.

Figure 4A:
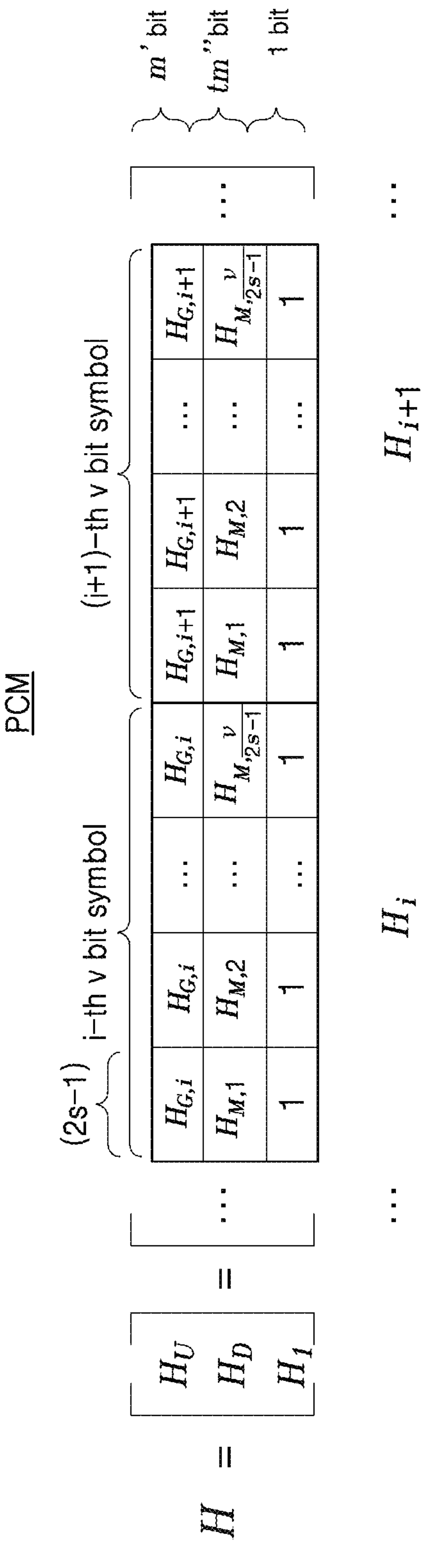
FIGS. 4A and 4B illustrate a parity check matrix of a spotty and adjacent symbol error correction (SASEC) code according to implementations.

FIG. 4A illustrates a PCM of a SASEC code according to implementations.

Referring to FIG. 4A, shown is the PCM of a SASEC code. The PCM may be a combination of 3 types of matrixes. The PCM may include a first sub-parity check matrix $H_U$, a second sub-parity check matrix $H_D$, and a third sub-parity check matrix $H_l$.

According to implementations, the first sub-parity check matrix $H_U$ is a matrix related to a corrected LRC. The LRC may include a Reed-Solomon (RS) code. The second sub-parity check matrix $H_D$ is a matrix related to BCH code. For example, the second sub-parity check matrix $H_D$ may be related to an interleaved BCH code. The third sub-parity check matrix $H_1$ is an all-one vector.

Referring to FIG. 4A, in terms of a symbol, the PCM may include a parity check matrix $H_i$ with respect to an i-th symbol, where i is a positive integer. Furthermore, the PCM may include a parity check matrix $H_{i+1}$ with respect to an (i+1)-th symbol. The parity check matrix $H_i$ and the parity check matrix $H_{i+1}$ may both include a v bit. For example, the parity check matrix $H_i$ may have a size of $$\left(p_G + \left\lceil \log_2\left(\max\left\{2s-1, \frac{v}{2s-1}\right\}+1\right)\right\rceil + 1\right) \times \mathrm{V}.$$

Here, $p_G$ may denote a global parity bit, which is described below in FIG. 4B.

The PCM including the first sub-parity check matrix $H_U$, the second sub-parity check matrix $H_D$, and the third sub-parity check matrix $H_1$ may be represented as follows.

$$H = \begin{bmatrix} H_U \\ H_D \\ 1 \end{bmatrix} \quad \text{[Equation 2]}$$

The PCM according to the (t, s, v) SASEC may be generated through the following process. For the integers t, s, and v, s denotes adjacency between erroneous bits, t denotes error correction capability, and v denotes the length of a symbol.

m, m', and m" may be obtained through the following equations.

$$2s - 1 \le m + \frac{m}{t} \quad \text{[Equation 3]}$$

$$m' = \left\lceil \frac{\log_2((2^m - 1)v + 1)}{m} \right\rceil \quad \text{[Equation 4]}$$

$$m'' \ge \log_2\left(1 + \min\left\{2s-1, \frac{v}{2s-1}\right\}\right) \quad \text{[Equation 5]}$$

m is the minimum positive number satisfying Equation 3. m" is the minimum positive number satisfying Equation 5. Primitive elements $\alpha^i$ and $\gamma^i$ of a finite field GH $2^{m'}$ and a finite field GH $2^{m''}$ may be respectively obtained with respect to the m' and m". Binary vectors having sizes of 1×m' and 1×m" may be obtained based on a conversion formula and primitive elements $\alpha^i$ and $\gamma^i$. The binary vectors may be stored in a ROM table.

The first sub-parity check matrix $H_U$ and the second sub-parity check matrix $H_D$ may be represented as follows.

$$H_U = \{H_{G,1}, \ldots, H_{G,1}, H_{G,2}, \ldots, H_{G,2}, \ldots\} \quad \text{[Equation 6]}$$

$$H_D\left[H_{M,1}, \ldots, H_{M,\frac{v}{2s-1}}, H_{M,1}, \ldots, H_{M,\frac{v}{2s-1}}, \ldots\right] \quad \text{[Equation 7]}$$

In Equation 6, $H_{G,1}$ to $H_{G,1}$ are matrixes for a first symbol, and $H_{G,2}$ to $H_{G,2}$ are matrixes for a second symbol. In Equation 7, $H_{M,1}$ to $H_{M,v/(2s-1)}$ are repeated for each symbol. A parity check matrix $H_G$, which is a part of the first sub-parity check matrix $H_U$, may be represented as $$\left[H_{G,1}, H_{G,2}, \ldots, H_{G,\frac{n}{v}}\right].$$

$H_M$, which is a part of the second sub-parity check matrix $H_D$, may be represented as $$\left[H_{M,1}, H_{M,2}, \ldots, H_{M,\frac{v}{2s-1}}\right].$$

According to implementations, the parity check matrix $H_{G,i}$ may be represented as the following equation.

$$H_{G,i} = \left([\alpha^i], \left[\alpha\frac{2^{m'}-1}{2^m-1}+i\right], \ldots, \left[\alpha\frac{(m-1)(2^{m'}-1)}{2^m-1}+i\right], \sum\nolimits_{j\in|0,t-1|}\left[\alpha\frac{j(2^{m'}-1)}{2^m-1}+i\right], \sum\nolimits_{j\in[t,2t-1]}\left[\alpha\frac{j(2^{m'}-1)}{2^m-1}+i\right], \ldots\right) \quad \text{[Equation 8]}$$

Furthermore, a parity check matrix $H_{M,i}$ may be represented as follows.

$$H_{M,i} = \begin{pmatrix} [\gamma^i] & \ldots & [\gamma^{i+2s-1}] \\ \ldots & \ldots & \ldots \\ [\gamma^{i+(2t-1)}] & \ldots & [\gamma^{i+(2t-1)\,(2s-2)}] \end{pmatrix} \quad \text{[Equation 9]}$$

According to implementations, the parity check matrix $H_{G,i}$ and the parity check matrix $H_{M,i}$ may be represented as follows.

Referring to FIG. 4A, the vertical length of the parity check matrix $H_{G,i}$ is m' bits. The vertical length of the parity check matrix $H_{M,i}$ is tm" bits. In other words, the vertical length of the first sub-parity check matrix $H_U$ is m' bits, and the vertical length of the second sub-parity check matrix $H_D$ is tm" bits. The vertical length of the third sub-parity check matrix $H_1$ is 1 bit.

Figures 4B, 5A:
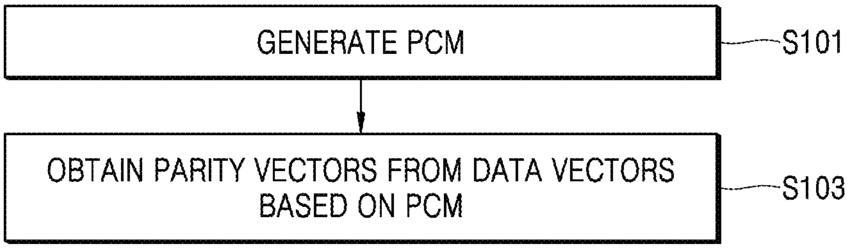
FIG. 5A is a flowchart of an operation method of an encoder, according to implementations.

FIG. 4B illustrates a PCM of the SASEC code according to implementations.

The PCM may be a combination of 3 types of matrixes. The PCM may include the first sub-parity check matrix $H_U$, the second sub-parity check matrix $H_D$, and the third sub-parity check matrix $H_1$.

According to implementations, the first sub-parity check matrix $H_U$ may be a matrix related to a corrected LRC code. The second sub-parity check matrix $H_D$ may be a matrix related to a BCH code. The third sub-parity check matrix $H_1$ may be an all-one vector.

The PCM may include the parity check matrix $H_i$ with respect to an i-th symbol, where i is a positive integer. Furthermore, the PCM may include the parity check matrix $H_{i+1}$ with respect to an (i+1)-th symbol. The parity check matrix $H_i$ and the parity check matrix $H_{i+1}$ may both include a v bit. For example, the parity check matrix $H_i$ may have a size of $$\left(p_G + \left\lceil \log_2\left(\max\left\{2s-1, \frac{v}{2s-1}\right\}+1\right)\right\rceil + 1\right) \times V.$$

Here, $p_G$ may denote a global parity bit, which is described below in detail.

In connection with the first sub-parity check matrix $H_U$, an LRC code is described to explain a modified LRC. The LRC is adopted to improve reliability. The binary linear LRC of locality T and disjoin $$\frac{n}{r+1}$$

repair groups is assumed. Then, LRC $\mathcal{C}$ may include global parities of $P_G$-bit used for the local parity of $$p_L = \frac{n}{r+1} - \text{bit}$$

connected to r+1 nodes and expansion of the Hamming distance.

The PCM of a binary LRC ($H_{LRC}$) may be represented as follows.

$$H_{LRC} = \begin{pmatrix} & H_G & & \\ \hline 1_{r+1} & 0_{r+1} & \ldots & 0_{r+1} \\ 0_{r+1} & 1_{r+1} & \ldots & 0_{r+1} \\ \ldots & \ldots & \ldots & \ldots \\ 0_{r+1} & 0_{r+1} & \ldots & 1_{r+1} \end{pmatrix} \quad \text{[Equation 10]}$$

In Equation 10, a binary global submatrix $H_G$ is a $p_G \times n$ matrix.

A (t/s/v)-SASEC code is described. The binary global submatrix $H_G$ satisfying $$(2s-1)|v,\ v|n,\ \ m' \geq \left\lceil \log_2\left(\max\left\{2s-1, \frac{v}{2s-1}\right\}+1\right)\right\rceil$$

may be represented as follows assuming that the binary global submatrix $H_G$ is a submatrix of Equation 10 having a size of $$p_G \times \frac{(2s-1)n}{v}$$

in a ((2 s–1)v, k, d≥2t+1, 2s–2) binary linear LRC.

$$H_G = \left[H_{G,1}, \ldots, H_{G,\frac{n}{v}}\right] \quad \text{[Equation 11]}$$

When a binary matrix $H_{M,i}$ is a (t–1)m'×(2s–1) matrix of the matrix of Equation 11, a binary matrix may be represented as Equation 12, a binary matrix $H_{U,l}$ having a size of $$p_G \times \frac{(2s-1)n}{v}$$

and a binary matrix $H_{L,l}$ having a size of $$\left\lceil \log_2\left(\max\left\{2s-1, \frac{v}{2s-1}\right\}+1\right)\right\rceil \times \frac{(2s-1)n}{v}$$

may be represented as Equation 13.

$$H_{M,i} = \begin{pmatrix} T(\gamma^i, 2s-1) \\ \ldots \\ T(\gamma^{i+(2t-1)}, 2s-1) \end{pmatrix} = \begin{pmatrix} [\gamma^i] & [\gamma^{i+1}] & \ldots & [\gamma^{i+2s-2}] \\ \ldots & \ldots & \ldots & \ldots \\ [\gamma^{i+(2t-1)}] & [\gamma^{i+2(2t-1)}] & \ldots & [\gamma^{i+(2s-2)(2t-1)}] \end{pmatrix} \quad \text{[Equation 12]}$$

$$H_{U,l} = (H_{G,l}\ \ H_{G,l}\ \ \ldots\ \ H_{G,l}) \text{ and} \quad \text{[Equation 13]}$$

$$H_{L,l} = \left(H_{M,1}\ \ H_{M,2}\ \ \ldots\ \ H_{M,\frac{v}{2s-1}}\right)$$

In this case, the PCM is represented as follows as shown in FIG. 4B.

$$H = \begin{pmatrix} H_U \\ H_D \\ 1 \end{pmatrix} = \begin{pmatrix} H_{U,1} & H_{U,2} & \ldots & H_{U,\frac{n}{v}} \\ H_{L,1} & H_{L,2} & \ldots & H_{L,\frac{n}{v}} \\ 1 & 1 & \ldots & 1 \end{pmatrix} \quad \text{[Equation 14]}$$

With $$p = p_G + \left\lceil \log_2\left(\max\left\{2s-1, \frac{v}{2s-1}\right\}+1\right)\right\rceil + 1$$

parities, the (t/s/v)-SASEC code may be generated from the PCM.

FIG. 5A is a flowchart of an operation method of an encoder, according to implementations.

FIG. 5B illustrates the SASEC according to implementations. FIG. 5C illustrates an encoding output according to implementations.

FIGS. 5A to 5C may be described with reference to FIGS. 2 and 3.

In operation S101, the encoder 200 may generate a PCM. For example, the encoder 200 may generate the PCM of the SASEC code described above in FIG. 4A. In other words, the encoder 200 may generate the PCM including the first sub-parity check matrix $H_U$, the second sub-parity check matrix $H_D$, and the third sub-parity check matrix $H_1$. For example, FIG. 5B illustrates the structure of the SASEC when (t, s, v) are (2, 3, 10).

In operation S103, the encoder 200 may obtain parity vectors from data vectors based on the PCM. For example, the encoder 200 may generate a sub-matrix P having a size of (n−k)×(n −k) from invertible (n−k) columns of a PCM having a size of (n−k)×n, where n and k are positive integers. The encoder 200 may generate a matrix having a size of (n−k)×k from k columns corresponding to the other portion excluding invertible (n−k) columns from the PCM having a size of (n−k)×n, where n and k are positive integers. Accordingly, the PCM may be represented as $H=([H_R P])$. Here, π denotes permutation of a column unit. The encoder 200 may obtain $P^{-1}H=\pi([P^{-1}H_R I])$ by multiplying the PCM by an inversed P. The encoder 200 may obtain a parity vector p of (n−k) bits from a k-bit data vector d. For example, the encoder 200 may obtain the parity vector p by calculating $(P^{-1}H_R)d=p$. FIG. 5C illustrates an example of an output value output as the encoder 200 calculates $(P^{-1}H_R)d$.

Figure 6A:
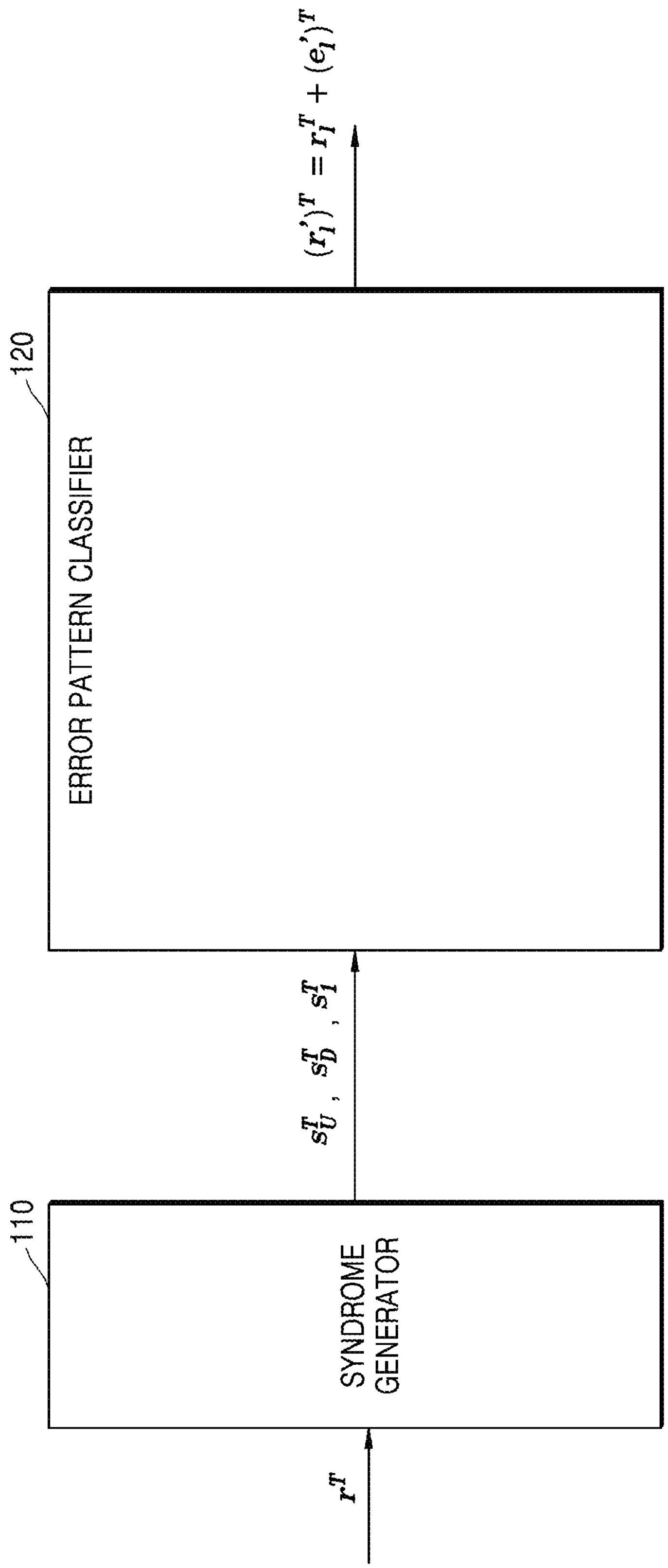
FIGS. 6A and 6B are block diagrams of a decoder according to implementations.

FIG. 6A is a block diagram of a decoder according to implementations.

FIG. 6A may be described with reference to FIGS. 1A, 1B, 3, and 4. The decoder 100 may include a syndrome generator 110 and an error pattern classifier 120.

The syndrome generator 110 may generate the first syndrome, the second syndrome, and the third syndrome based on a reception vector $r^T$ and the PCM, and output the first syndrome, the second syndrome, and the third syndrome. The PCM may include the first sub-parity check matrix, the second sub-parity check matrix, and the third sub-parity check matrix, the first sub-parity check matrix may be based on the LRC, the second sub-parity check matrix may be based on the BCH code, and the third sub-parity check matrix may be an all-one vector.

The syndrome generator 110 may generate a first syndrome $$S_U^T$$

by multiplying the reception vector $r^T$ and the first sub-parity check matrix, a second syndrome $$S_D^T$$

by multiplying the reception vector $r^T$ and the second sub-parity check matrix, and a third syndrome $$S_1^T$$

by multiplying the reception vector $r^T$ and the third sub-parity check matrix.

The error pattern classifier 120 may be configured to receive a first syndrome, obtain symbol error location information obtained based on the mapping information between the SASE and the first syndrome; change the first syndrome into a normalized syndrome based on the first received symbol, obtain an adjacent error vector based on mapping information between the normalized syndrome, the second syndrome, and the third syndrome and the SASE and correct an error of the reception vector based on the symbol error location information and the adjacent error vector. When the first syndrome, the second syndrome, and the third syndrome are all all-zero vectors, the error pattern classifier 120 may output an NE flag signal (no error). When the normalized syndrome is not obtained, the error pattern classifier 120 may output a DUE flag signal (detected, uncorrectable error). When obtaining the adjacent error vector in a symbol indicated by the symbol error location information, the error pattern classifier 120 may output a CE flag (correctable error).

Figure 6B:
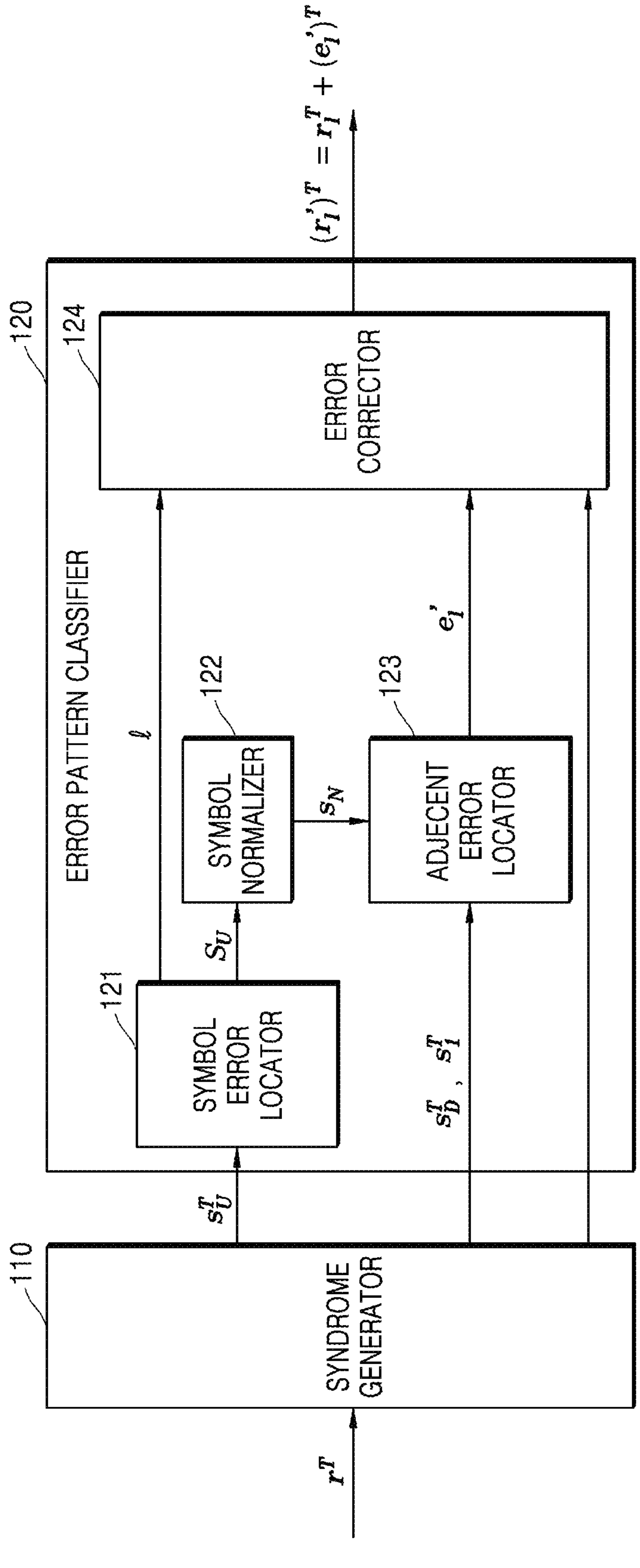

FIG. 6B is a block diagram of a decoder according to implementations.

FIG. 6B may be described with reference to FIGS. 1A and 1B and FIGS. 4A and 4B.

Referring to FIG. 6B, the decoder 100 may include a syndrome generator 110 and an error pattern classifier 120. FIG. 6B shows a structure of the low-complexity syndrome decoder 100 for (t, s, v) SASE codes.

The decoder 100 of SASEC codes uses a memory space for storing mapping with a correctable SASE and a corresponding syndrome after syndrome generation. When a single ROM table is used, a table size may be $|\mathcal{E}_{\mathcal{A}}|\times(p+n)$ with respect to a codelength n. $|\mathcal{E}_{\mathcal{A}}|$ indicates the number of (t, s, v) SASEs in one symbol. p may denote the number of parities. n may denote a codelength. The decoder 100 according to implementations may reduce the size of a ROM table by using structural properties of a SASEC code. In the disclosure, $$\mathcal{I}_S=\left[\frac{n}{v}\right]$$

may be an index set of symbols, and $\mathcal{E}_{\mathcal{A},\mathcal{F}}$ may be a set of normalized SASEs. SASEs located in the first symbol may be included only in $\mathcal{E}_{\mathcal{A},\mathcal{F}}$. The cardinality of the two sets may be represented as the following equation.

$$|\mathcal{I}_S|=\frac{(2^m-1)n}{v},\ \text{for } m \text{ satisfying } 2s-1\le m+\left\lfloor\frac{m}{t}\right\rfloor \text{ and } |\mathcal{E}_{\mathcal{A},F}|=\frac{|\mathcal{E}_{\mathcal{A}}|}{n/v}. \quad \text{[Equation 15]}$$

The error pattern classifier 120 may include a symbol error locator 121, a symbol normalizer 122, an adjacent error locator 123, and an error corrector 124.

The syndrome generator 110 may receive an n-length vector $r^T$. The syndrome generator 110 may generate three syndromes based on the reception vector $r^T$. The syndrome generator 110 may generate a syndrome for the location of a symbol and a syndrome for an adjacent error with respect to the reception vector $r^T$. For example, the syndrome generator 110 may generate a first syndrome $$S_U^T$$

by using the reception vector $r^T$ and the first sub-parity check matrix. The syndrome generator 110 may generate a second syndrome $$S_D^T$$

by using the reception vector $r^T$ and the second sub-parity check matrix. Furthermore, the syndrome generator 110 may generate a third syndrome $$S_1^T$$

by using the reception vector $r^T$ and the third sub-parity check matrix. When $S_U=S_D=0$ and $S_1=0$, the syndrome generator 110 may transmit an NE flag to a system (e.g., the memory system 1 or the computing system 2). Otherwise, the generated syndromes are used by the error pattern classifier 120.

The error pattern classifier 120 may classify error patterns according to the first syndrome vector $S^U$ and the second syndrome vector $S_D$ obtained from the syndrome generator 110.

The symbol error locator 121 may determine a symbol index l based on the first syndrome vector $S_U$ satisfying $S_U \in a'\mathbb{F}_2m$ by using a ROM table $\mathcal{T}_S$. When a syndrome corresponding to an l-th symbol exists, the symbol error locator 121 may transmit the symbol index l to the error corrector 124.

The symbol normalizer 122 may receive the first syndrome vector $S_U$ from the symbol error locator 121. The symbol normalizer 122 may change the first syndrome vector to a syndrome for the first symbol. The symbol normalizer 122 may obtain a normalized vector $S_N$. For example, the symbol normalizer 122 may obtain the normalized vector $S_N$ through an equation such as $S_N=T^{-vl} S_U$.

The adjacent error locator 123 may receive the normalized vector $S_N$ from the symbol normalizer 122. When the symbol error locator 121 has found the symbol index l, the adjacent error locator 123 may find an adjacent error sub-vector $$e_l'$$

in the l-th symbol from a ROM table $\mathcal{T}_A$, the normalized syndrome vector $S_N$, the second syndrome $$S_D^T,$$

and the third syndrome $$S_1^T.$$

The adjacent error locator 123 may find the adjacent error sub-vector $$e_l'$$

in the l-th symbol from the normalized syndrome vector $S_N$, the second syndrome $$S_D^T,$$

and the third syndrome $$S_1^T$$

through the ROM table $\mathcal{T}_A$.

The error corrector 124 may correct the CEs declared by the error corrector 124. For example, the error corrector 124 may correct an error based on a bit-wise addition. The error corrector 124 may correct an error by adding a result of performing a right-cyclic shift on an error vector to the reception vector $r^T$. For example, the error corrector 124 may correct an error through an equation such as $$(r_l')^T = r_l^T + (e_l')^T.$$

Figure 7:
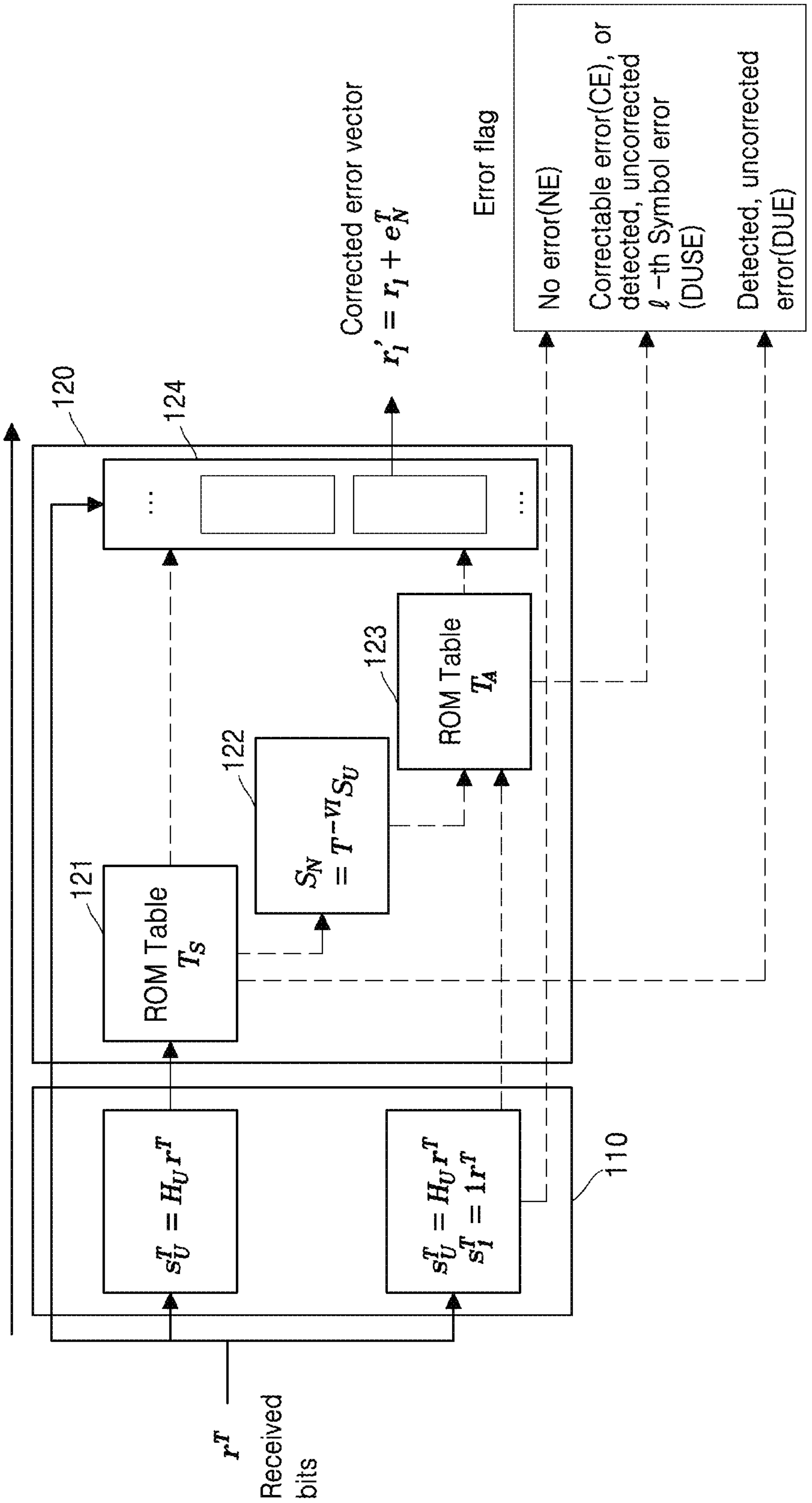
FIG. 7 is a block diagram of a decoder according to implementations.

FIG. 7 is a block diagram of the decoder 100 according to implementations.

FIG. 7 may be described with reference to FIG. 6, and any redundant description may be omitted. The syndrome and the syndrome vector may be interchangeably used.

The syndrome generator 110 may receive the n-length vector $r^T$. The syndrome generator 110 may generate three syndromes based on the reception vector $r^T$. The syndrome generator 110 may generate a syndrome for the location of a symbol and a syndrome for an adjacent error based on the reception vector $r^T$. For example, the syndrome generator 110 may generate the first syndrome $$S_U^T$$

by using the reception vector $r^T$ and the first sub-parity check matrix. The syndrome generator 110 may generate the second syndrome $$S_D^T$$

by using the reception vector $r^T$ and the second sub-parity check matrix. Furthermore, the syndrome generator 110 may generate the third syndrome $$S_1^T$$

by using the reception vector $r^T$ and the third sub-parity check matrix. When $S_U=S_D=0$ and $S_1=0$, the syndrome generator 110 may transmit an NE state to the system (e.g., the memory system 1 or the computing system 2). Otherwise, the generated syndrome vectors are used by the error pattern classifier 120.

The error pattern classifier 120 may classify error patterns according to the first syndrome vector $S_U$ and the second syndrome vector $S_D$ obtained from the syndrome generator 110.

The symbol error locator 121 may determine the symbol index l based on the first syndrome vector $S_U$ satisfying $S_U \in a' \mathbb{F}_2 m$ by using the ROM table $\mathcal{T}_S$. When a syndrome corresponding to the l-th symbol exists, the symbol error locator 121 may transmit the symbol index l to the error corrector 124.

For (t, s, v) SASEC codes, the size of the ROM table $\mathcal{T}_S$ may be $$|\mathcal{T}_S| \times \left(p_G + \left\lceil \log_2\left(1 + \frac{n}{v}\right)\right\rceil\right).$$

The symbol normalizer 122 may receive the first syndrome vector $S_U$ from the symbol error locator 121. The symbol normalizer 122 may change the first syndrome to a syndrome for the first symbol. The symbol normalizer 122 may obtain the normalized vector $S_N$. For example, the symbol normalizer 122 may obtain the normalized vector $S_N$ through the equation such as $S_N=T^{-vl} S_U$. When the symbol normalizer 122 fails to obtain the normalized vector $S_N$, at least one of the symbol normalizer 122 and the symbol error locator 121 may transmit a DUE flag signal to the system (e.g., the memory system 1 or the computing system 2).

The adjacent error locator 123 may receive the normalized vector $S_N$ from the symbol normalizer 122. When the symbol error locator 121 has found the symbol index l, the adjacent error locator 123 may find the adjacent error sub-vector $$e_l'$$

in the l-th symbol from the ROM table $\mathcal{T}_A$, the normalized syndrome vector $S_N$, the second syndrome $$S_D^T,$$

and the third syndrome $$S_1^T.$$

When the symbol error locator 121 has found the symbol index l, the adjacent error locator 123 may find the adjacent error sub-vector $$e_l'$$

in the l-th symbol and transmit a CE flag to the system (e.g., the memory system 1 or the computing system 2).

When the symbol error locator 121 fails to find the symbol index l, the adjacent error locator 123 may transmit a detectable, but uncorrected symbol error (DUSE) flag signal to the system (e.g., the memory system 1 or the computing system 2).

The error corrector 124 may correct the CEs declared by the error corrector 124. For example, the error corrector 124 may correct an error through the equation such as $$(r_l')^T = r_l^T + (e_l')^T.$$

Figure 8:
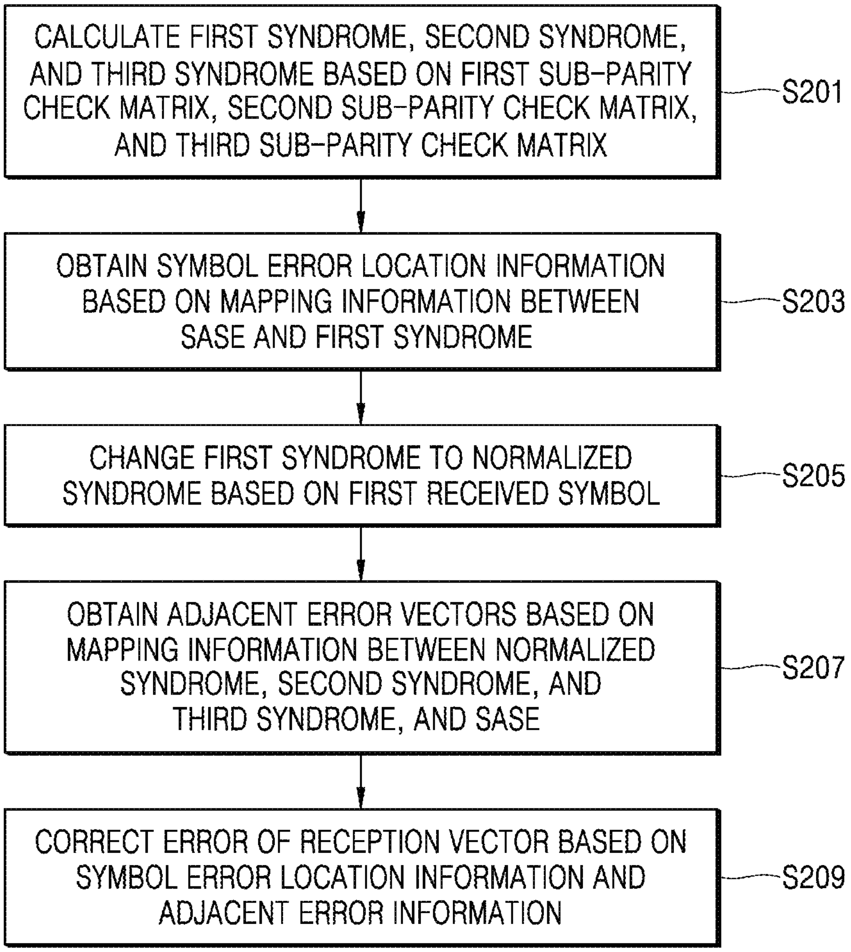
FIG. 8 is a flowchart of an operation method of a decoder, according to implementations.

FIG. 8 is a flowchart of an operation method of a decoder, according to implementations.

FIG. 8 may be described with reference to FIGS. 1 and 6, and any redundant description may be omitted.

In operation S201, the decoder 100 may generate the first syndrome, the second syndrome, and the third syndrome by using the first sub-parity check matrix, the second sub-parity check matrix, and the third sub-parity check matrix.

In operation S203, the decoder 100 may obtain symbol error location information based on mapping information between the SASE and the first syndrome.

In operation S205, the decoder 100 may change the first syndrome to a normalized syndrome based on the first received symbol.

In operation S207, the decoder 100 may obtain adjacent error vectors based on mapping information between the normalized syndrome, the second syndrome, and the third syndrome and the SASE.

In operation S209, the decoder 100 may correct the error of a reception vector based on the symbol error location information and the adjacent error information.

Figure 9:
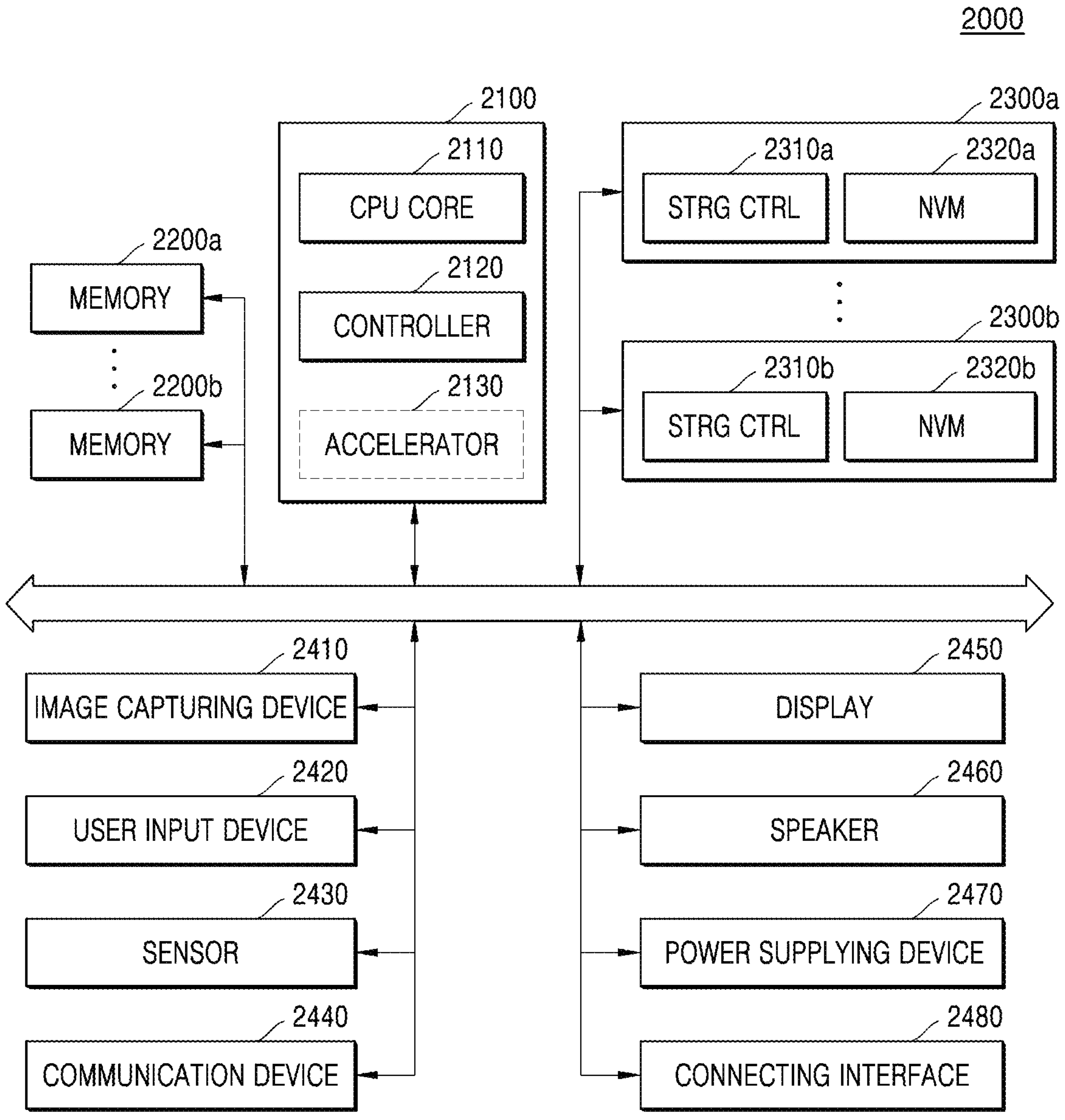
FIG. 9 is a block diagram of a system adopting a storage device according to implementations.

FIG. 9 is a block diagram of a system 2000 adopting a storage device according to implementations.

Referring to FIG. 9, the system 2000 may basically include a mobile system, such as a portable communication terminal (a mobile phone), a smartphone, a tablet personal computer (PC), a wearable device, a healthcare device, or an Internet of Things (IoT) device. However, the system 2000 of FIG. 9 is not necessarily limited to a mobile system and may include an automotive device, such as a personal computer, a laptop computer, a server, a media player, or a navigation device.

Referring to FIG. 9, the system 2000 may include a main processor 2100, memories 2200*a* and 2200*b*, and storage devices 2300*a* and 2300*b*, and additionally include one or more of an image capturing device 2410, a user input device 2420, a sensor 2430, a communication device 2440, a display 2450, a speaker 2460, a power supplying device 2470, and a connecting interface 2480.

The main processor 2100 may control the overall operation of the system 2000, including detailed operations of other components forming the system 2000. The main processor 2100 may be implemented by a general purpose processor, a dedicated processor, or an application processor.

The main processor 2100 may include one or more central processing unit (CPU) cores 2110 and a controller 2120 to control the memories 2200*a* and 2200*b* and/or the storage devices 2300*a* and 2300*b*. According to implementations, the main processor 2100 may further include an accelerator 2130 that is a dedicated circuit for a high-speed data operation, such as an artificial intelligence (AI) data operation and the like. The accelerator 2130 may include a graphics processing unit (GPU), a neural processing unit (NPU), a data processing unit (DPU), and/or the like and may be implemented by a physically independent and separate chip from other components of the main processor 2100.

The memories 2200*a* and 2200*b* may be used as a main memory device of the system 2000 and may include a volatile memory, such as SRAM, DRAM, and/or the like, and a non-volatile memory, such as a flash memory, PRAM and/or RRAM, and the like. The memories 2200*a* and 2200*b* may be implemented in the same package with the main processor 2100.

The storage devices 2300*a* and 2300*b* may function as a non-volatile storage device for storing data regardless of a power supply and may have relatively large storage capacity compared with the memories 2200*a* and 2200*b*. The storage devices 2300*a* and 2300*b* may include storage controllers STRG CTRL 2310*a* and 2310*b* and non-volatile memories (NVMs) 2320*a* and 2320*b* for storing data under the control of the storage controllers 2310*a* and 2310*b*. The NVMs 2320*a* and 2320*b* may include a flash memory having a 2D structure or 3-dimensional (3D) vertical NAND (V-NAND) structure and may also include a non-volatile memory of a different type, such as PRAM, RRAM, and/or the like.

The storage devices 2300*a* and 2300*b* may be included in the system 2000 in a state of physically being separated from the main processor 2100 and may be implemented in the same package with the main processor 2100. Furthermore, as the storage devices 2300*a* and 2300*b* may have a shape, such as an SSD or a memory card, and the storage devices 2300*a* and 2300*b* may be detachably coupled to other components of the system 2000 through an interface such as the connecting interface 2480 to be described below. The storage devices 2300*a* and 2300*b* as described above may be devices following standard protocols, such as UFS, eMMC, or NVMe, but the disclosure is not limited thereto.

The image capturing device 2410 may capture a still image or a video and may include a camera, a camcorder, and/or a webcam.

The user input device 2420 may receive various types of data input by a user of the system 2000 and may include a touch pad, a keypad, a keyboard, a mouse, and/or a microphone.

The sensor 2430 may sense various types of physical quantities obtained from the outside of the system 2000 and may convert the sensed physical quantities into electrical signals. The sensor 2430 may include a temperature sensor, a pressure sensor, an illuminance sensor, a location sensor, an acceleration sensor, a biosensor, and/or gyroscope sensor.

The communication device 2440 may perform signal transmission and receiving between the system 2000 and other external devices. The communication device 2440 may be implemented by including an antenna, a transceiver, a MODEM, and/or the like.

The display 2450 and the speaker 2460 may function as output devices to respectively output visual information and auditory information to a user of the system 2000.

The power supplying device 2470 may appropriately convert and supply power supplied from a battery (not shown) included in the system 2000 and/or an external power source, to each component of the system 2000.

The connecting interface 2480 may provide a connection between the system 2000 and an external device that is connected to the system 2000 to exchange data with the system 2000. The connecting interface 2480 may be implemented by various interface methods, such as an advanced technology attachment (ATA), a serial ATA (SATA), an external SATA (e-SATA), a small computer small interface (SCSI), a serial attached SCSI (SAS), a peripheral component interconnection (PCI), a PCI express (PCIe), NVMe, IEEE 1394, a universal serial bus (USB), a secure digital (SD) card, a multi-media card (MMC), eMMC, UFS, an embedded universal flash storage (eUFS), a compact flash (CF) card interface, and the like. The data transceived through the connecting interface 2480 may have an error pattern described above in FIG. 3A. The system 2000 may further include the decoder 100 of FIG. 1A and may perform an error correction based on the SASEC code.

Figure 10:
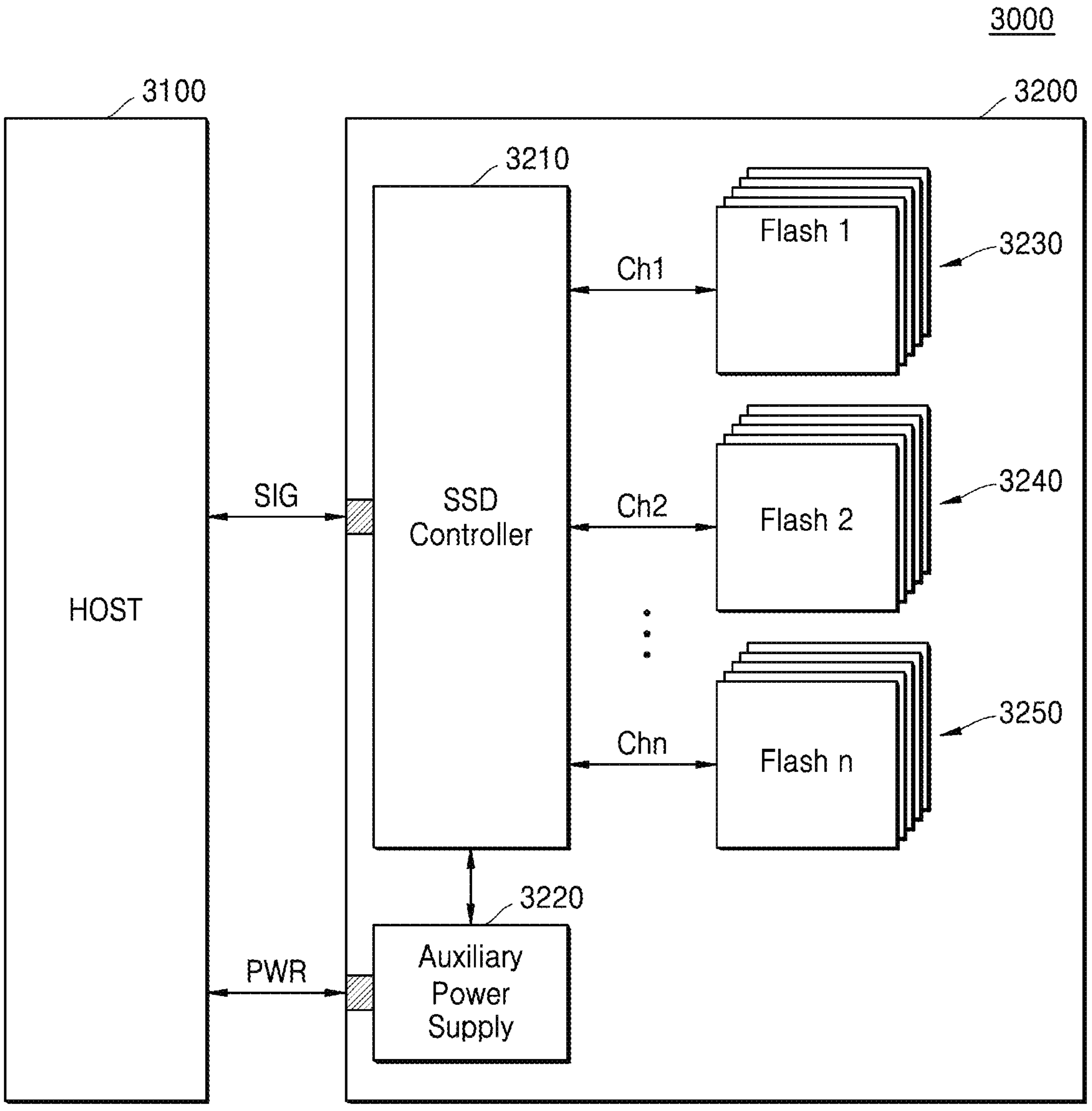
FIG. 10 is a block diagram showing an example in which a memory controller according to implementations is applied to a solid state drive (SSD) system.

FIG. 10 is a block diagram showing an example in which a memory controller according to implementations is applied to an SSD system 3000.

Referring to FIG. 10, the SSD system 3000 may include a host HOST 3100 and an SSD 3200. The SSD 3200 may exchange signals SIG with the host 3100 through a signal connector and may receive power PWR through a power connector. The SSD 3200 may include an SSD controller 3210, an auxiliary power supply 3220, and memory devices 3230, 3240, and 3250. The SSD 3200 may be implemented by using the implementations described above with reference to FIGS. 1 to 8. For example, when exchanging signals with the host 3100, the SSD 3200 may perform an error correction based on the SASEC code.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While the disclosure has been particularly shown and described with reference to preferred implementations using specific terminologies, the implementations and terminologies should be considered in descriptive sense only and not for purposes of limitation. Therefore, it will be understood by those of ordinary skill in the art that various changes in form and details may be made therein without departing from the spirit and scope of the disclosure as defined by the following claims.

What is claimed is:

1. A decoder comprising:

a syndrome generator configured to generate a first syndrome, a second syndrome, and a third syndrome based on a reception vector and a parity check matrix and to output the first syndrome, the second syndrome, and the third syndrome;

a symbol error locator configured to receive the first syndrome and output symbol error location information obtained based on mapping information between a spotty and adjacent symbol error (SASE) and the first syndrome;

a symbol normalizer configured to change the first syndrome to a normalized syndrome based on a first received symbol and to output the normalized syndrome;

an adjacent error locator configured to receive the normalized syndrome from the symbol normalizer, to receive the second syndrome and the third syndrome from the syndrome generator, and to output an adjacent error vector; and an error corrector configured to receive the symbol error location information from the symbol error locator, to receive the adjacent error vector from the adjacent error locator, and to correct an error of the reception vector, wherein the SASE includes an error pattern based on adjacency between erroneous bits among bits in a 2-dimensional array, a number of error bits within the adjacency, and a length of the first received symbol.

2. The decoder of claim 1, wherein the parity check matrix comprises a first sub-parity check matrix, a second sub-parity check matrix, and a third sub-parity check matrix, and the syndrome generator is further configured to:

generate the first syndrome based on the reception vector and the first sub-parity check matrix;

generate the second syndrome based on the reception vector and the second sub-parity check matrix; and generate the third syndrome based on the reception vector and the third sub-parity check matrix.

3. The decoder of claim 2, wherein the first sub-parity check matrix is based on a locally repairable code (LRC), the second sub-parity check matrix is based on a Bose-Chaudhuri-Hocquenghem (BCH) code, and the third sub-parity check matrix is an all-one vector.

4. The decoder of claim 1, wherein the adjacent error locator is further configured to output the adjacent error vector based on mapping information between the normalized syndrome, the second syndrome, the third syndrome, and the SASE.

5. The decoder of claim 1, wherein, when the first syndrome, the second syndrome, and the third syndrome are all all-zero vectors, the syndrome generator is further configured to output a no error (NE) flag signal.

6. The decoder of claim 1, wherein, when the normalized syndrome is not obtained, at least one of the symbol normalizer and the symbol error locator is further configured to output a detectable, but uncorrected error (DUE) flag signal.

7. The decoder of claim 1, wherein, when the adjacent error locator obtains the adjacent error vector in the first received symbol indicated by the symbol error location information, the adjacent error locator is further configured to output a correctable error (CE) flag.

8. A decoder comprising:

a syndrome generator configured to generate a first syndrome, a second syndrome, and a third syndrome based on a reception vector and on a parity check matrix and to output the first syndrome, the second syndrome, and the third syndrome; and an error pattern classifier configured to:

receive the first syndrome;

obtain symbol error location information obtained based on mapping information between a spotty and adjacent symbol error (SASE) and the first syndrome;

change the first syndrome to a normalized syndrome based on a first received symbol;

obtain an adjacent error vector based on mapping information between the normalized syndrome, the second syndrome, and the third syndrome and the SASE; and correct an error of the reception vector based on the symbol error location information and the adjacent error vector, wherein the SASE is an error pattern based on adjacency between erroneous bits among bits in a 2-dimensional array, a number of error bits within the adjacency, and a length of the first received symbol.

9. The decoder of claim 8, wherein the parity check matrix comprises a first sub-parity check matrix, a second sub-parity check matrix, and a third sub-parity check matrix, and the syndrome generator is further configured to:

generate the first syndrome based on the reception vector and the first sub-parity check matrix;

generate the second syndrome based on the reception vector and the second sub-parity check matrix; and generate the third syndrome based on the reception vector and the third sub-parity check matrix.

10. The decoder of claim 9, wherein the first sub-parity check matrix is based on a locally repairable code (LRC), the second sub-parity check matrix is based on a Bose-Chaudhuri-Hocquenghem (BCH) code, and the third sub-parity check matrix is an all-one vector.

11. The decoder of claim 8, wherein, when the first syndrome, the second syndrome, and the third syndrome are all all-zero vectors, the syndrome generator is further configured to output a no error (NE) flag signal decoder.

12. The decoder of claim 8, wherein, when the normalized syndrome is not obtained, the error pattern classifier is further configured to output a detectable, but uncorrected error (DUE) flag signal.

13. The decoder of claim 8, wherein, when the error pattern classifier obtains the adjacent error vector in the first received symbol indicated by the symbol error location information, and is further configured to output a correctable error (CE) flag decoder.

14. An operation method of a decoder, the operation method comprising:

generating a first syndrome, a second syndrome, and a third syndrome based on a reception vector and a parity check matrix;

obtaining symbol error location information based on mapping information between a spotty and adjacent symbol error (SASE) and the first syndrome;

changing the first syndrome to a normalized syndrome based on a first received symbol;

obtaining an adjacent error vector based on mapping information between the normalized syndrome, the second syndrome, and the third syndrome and the SASE; and correcting an error of the reception vector based on the symbol error location information and the adjacent error vector, wherein the SASE is an error pattern based on adjacency between erroneous bits, a number of error bits within the adjacency, and a length of the first received symbol.

15. The operation method of claim 14, wherein the parity check matrix comprises a first sub-parity check matrix, a second sub-parity check matrix, and a third sub-parity check matrix, and generating of the first syndrome, the second syndrome, and the third syndrome comprises:

generating the first syndrome based on the reception vector and the first sub-parity check matrix;

generating the second syndrome based on the reception vector and the second sub-parity check matrix; and generating the third syndrome based on the reception vector and the third sub-parity check matrix.

16. The operation method of claim 15, wherein the first sub-parity check matrix is based on a locally repairable code (LRC), the second sub-parity check matrix is based on a Bose-Chaudhuri-Hocquenghem (BCH) code, and the third sub-parity check matrix is an all-one vector.

17. The operation method of claim 14, further comprising, when the first syndrome, the second syndrome, and the third syndrome are all all-zero vectors, outputting a no error (NE) flag signal.

18. The operation method of claim 14, further comprising, when the normalized syndrome is not obtained, outputting a detectable, but uncorrected error (DUE) flag signal.

19. The operation method of claim 14, further comprising, when obtaining the adjacent error vector in a symbol indicated by the symbol error location information, outputting a correctable error (CE) flag.

20. The operation method of claim 14, wherein the SASE has a 2-dimensional array structure.

* * * * *